(12) United States Patent
Ling et al.

(10) Patent No.: US 10,643,955 B2
(45) Date of Patent: May 5, 2020

(54) METHOD OF MANUFACTURING SIP MODULE BASED ON DOUBLE PLASTIC-SEALING AND THE SIP MODULE

(71) Applicant: UNIVERSAL SCIENTIFIC INDUSTRIAL (SHANGHAI) CO., LTD., Shanghai (CN)

(72) Inventors: Dong-Feng Ling, Shanghai (CN); Chun Cao, Shanghai (CN); Yun-Gang Zou, Shanghai (CN)

(73) Assignee: UNIVERSAL SCIENTIFIC INDUSTRIAL (SHANGHAI) CO., LTD., Shanghai (CN)

( * ) Notice: Subject to any disclaimer, the term of this patent is extended or adjusted under 35 U.S.C. 154(b) by 0 days.

(21) Appl. No.: 16/207,739

(22) Filed: Dec. 3, 2018

(65) Prior Publication Data

US 2019/0385952 A1    Dec. 19, 2019

(30) Foreign Application Priority Data

Jun. 14, 2018 (CN) .......................... 2018 1 0615615

(51) Int. Cl.
| | |
|---|---|
| *H01L 21/56* | (2006.01) |
| *H05K 1/18* | (2006.01) |
| *H01L 23/552* | (2006.01) |
| *H01L 23/31* | (2006.01) |
| *H01L 23/00* | (2006.01) |

(Continued)

(52) U.S. Cl.
CPC ............ *H01L 23/552* (2013.01); *H01L 21/56* (2013.01); *H01L 21/561* (2013.01); *H01L 25/50* (2013.01); *H01L 23/3135* (2013.01); *H05K 3/28* (2013.01)

(58) Field of Classification Search
CPC ..... H01L 23/552; H01L 21/56; H01L 21/561; H01L 25/50
USPC .......................................... 257/659; 438/106
See application file for complete search history.

(56) References Cited

U.S. PATENT DOCUMENTS 9,780,041 B1 * 10/2017 Chien .................... H01L 23/552
9,881,875 B2 *  1/2018 Chen ..................... H01L 23/552
9,899,335 B2     2/2018 Chiu et al.
(Continued)

FOREIGN PATENT DOCUMENTS

CN          105810666 A    7/2016
TW          I585937 B      6/2017

*Primary Examiner* — Ly D Pham
(74) *Attorney, Agent, or Firm* — Li & Cai Intellectual Property (USA) Office

(57) ABSTRACT

A manufacturing method of a system in package (SiP) module based on double plastic-sealing, including: welding electronic units required by the SiP module onto a top surface of a Printed Circuit Board (PCB), with welding spots being reserved on a bottom surface of the PCB to obtain a PCB assembly (PCBA); implementing a first-time filling to fill on plastic materials on a top surface of the PCBA, ensuring that the plastic materials cover the electronic units, and obtaining a first-time plastic-sealing PCBA after the plastic materials are solidified; pasting tightly a functional film on a top surface of the first-time plastic-sealing PCBA to obtain a film-pasted PCBA; and implementing a second-time filling to fill on plastic materials on the film-pasted PCBA, ensuring that the plastic materials cover a top surface and a periphery of the film-pasted PCBA, and obtaining the SiP module after the plastic materials are solidified.

8 Claims, 5 Drawing Sheets

(51) Int. Cl.
*H01L 25/00* (2006.01)
*H05K 3/28* (2006.01)

(56) References Cited

U.S. PATENT DOCUMENTS

| | | | |
|---|---|---|---|
| 10,373,916 B2* | 8/2019 | Lin | H01L 23/3114 |
| 2014/0126159 A1* | 5/2014 | Lin | H01L 21/561 |
| | | | 361/736 |
| 2019/0387610 A1* | 12/2019 | Cao | H05K 9/0007 |

* cited by examiner

4a

4b

4c

METHOD OF MANUFACTURING SIP MODULE BASED ON DOUBLE PLASTIC-SEALING AND THE SIP MODULE

CROSS-REFERENCE TO RELATED PATENT APPLICATION

This application claims the benefit of priority to China Patent Application No. 201810615615.3, filed on Jun. 14, 2018 in People's Republic of China. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a system in package (SiP) module and a method of manufacturing the SiP module; more particularly, to a method of manufacturing the SiP module based on double plastic-sealing and the SiP module.

BACKGROUND OF THE DISCLOSURE

Currently, electronic products in the field of communication are made smaller with more integrated functions. As a result, spacings between internal electronic elements of the electronic products are smaller than before. In actual practice, a plastic sealing technique is required to be implemented onto the electronic elements in order to solidify a connection between the electronic elements and a printed circuit board (PCB) for preventing entry of external dust into the electronics elements so as to avoid electricity leakage and interference among the electronic elements.

Current manufacturing process of the thermoplastic sealing applies the surface mount technology (SMT) on a surface of the PCB to produce a printed circuit board assembly (PCBA), filling on plastic materials on a top surface of the PCBA to form a molding layer, and cutting the PCBA after the PCBA is solidified so as to obtain a system in package (SiP) module, in which no other subsidiary films or materials are attached upon electronic units that are mounted on the PCB. Electromagnetic shielding is implemented typically by sputtering a metal layer to form a film or by attaching the film onto the SiP module after the aforesaid plastic sealing, thereby achieving the effect of electromagnetic protection.

However, the process of implementing the electromagnetic shielding by sputtering to form the film after the aforesaid plastic sealing is complicated. For example, a binding force is difficult to be controlled when sputtering to form the film. Therefore, the manufacturing process of the SiP module becomes more complicated.

SUMMARY OF THE DISCLOSURE

In response to the above-referenced technical inadequacies, the present disclosure provides an SiP module and a method of manufacturing the SiP module that may simplify the manufacturing process of the SiP module.

In one aspect, the present disclosure provides a manufacturing method of a system in package (SiP) module based on double plastic-sealing. The manufacturing method includes the steps of: welding electronic units required by the SiP module onto a top surface of a Printed Circuit Board (PCB), with welding spots being reserved on a bottom surface of the PCB to obtain a PCB assembly (PCBA); implementing a first-time filling to fill on plastic materials on a top surface of the PCBA, ensuring that the plastic materials cover the electronic units on the top surface of the PCBA, and obtaining a first-time plastic-sealing PCBA after the plastic materials are solidified; pasting tightly a functional film on a top surface of the first-time plastic-sealing PCBA to obtain a film-pasted PCBA; and implementing a second-time filling to fill on plastic materials on the film-pasted PCBA, ensuring that the plastic materials cover a top surface and a periphery of the film-pasted PCBA, and obtaining the SiP module after the plastic materials of the second-time filling are solidified.

In certain embodiments, the present disclosure provides the manufacturing method of the SiP module based on double plastic-sealing, wherein the functional film includes: a plurality of film units being spaced apart from each other by cutting channels, wherein each of the cutting channels is connected to adjacent ones of the film units and is formed with a hollow portion, and wherein each of the film units corresponds to a respective one of the SiP modules.

In one aspect, the present disclosure provides the SiP module, including: the PCB having a top surface with electronic units required by the SiP module provided on the top surface, and a bottom surface with reserved welding spots provided on the bottom surface; a first plastic-sealing layer, with the electronic units covered therein; a functional film pasted tightly on a top surface of the first plastic-sealing layer; and a second plastic-sealing layer, covering the functional film and the first plastic-sealing layer.

In certain embodiments, the present disclosure provides the manufacturing method of the SiP module based on double plastic-sealing, wherein the functional film possesses electromagnetic shielding function.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The present disclosure will become more fully understood from the detailed description and the accompanying drawings, in which.

DETAILED DESCRIPTION OF THE EXEMPLARY EMBODIMENTS

Figure 1:
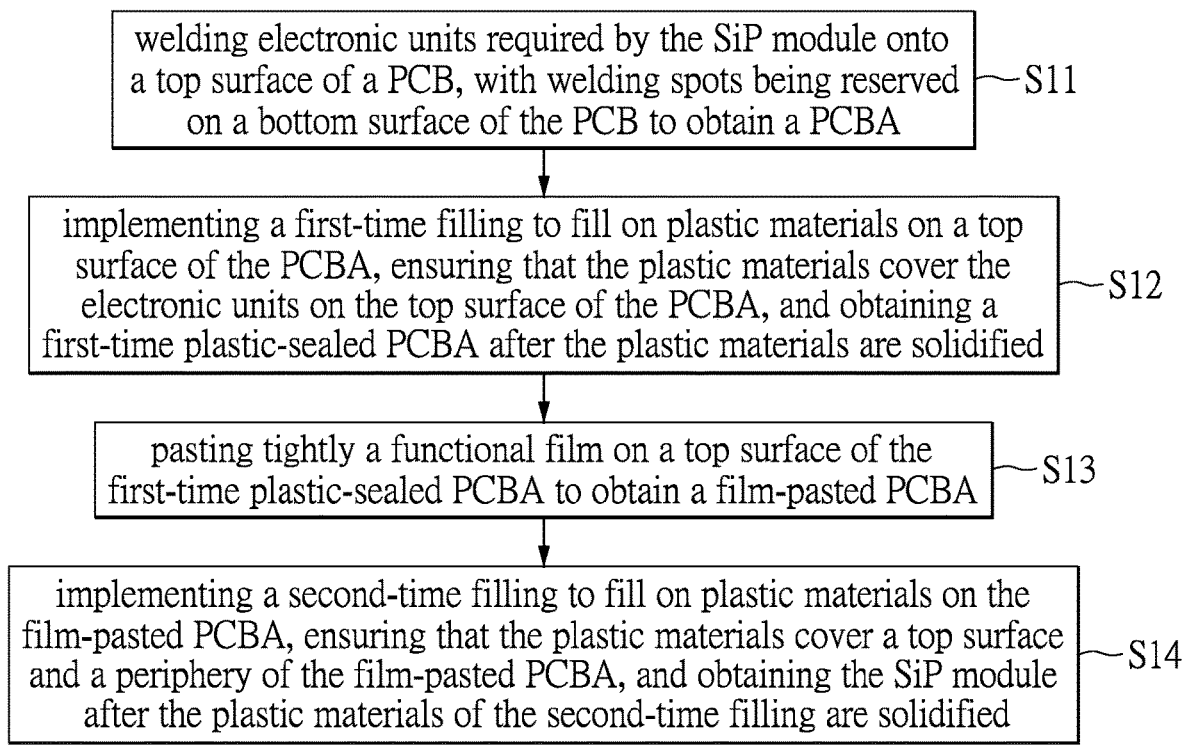
FIG. 1 is a flow chart of an embodiment of a manufacturing method of a system in package (SiP) module based on double plastic-sealing according to the present disclosure.

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a", "an", and "the" includes plural reference, and the meaning of "in" includes "in" and "on". Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first", "second" or "third" can be used to describe various components, signals or the like, which are for distinguishing one component/signal from another one only, and are not intended to, nor should be construed to impose any substantive limitations on the components, signals or the like.

The present disclosure provides a manufacturing method of a system in package (SiP) module characterized in that the manufacturing method of the SiP module based on double plastic-sealing according to an embodiment of the present disclosure, as shown in FIG. 1, includes the following steps of Step S11, Step S12, Step S13 and Step S14.

Step S11: welding electronic units 8 required by the SiP module onto a top surface of a Printed Circuit Board (PCB) 1, with welding spots being reserved on a bottom surface of the PCB 1 to obtain a PCB assembly (PCBA);

Step S12: implementing a first-time filling to fill on plastic materials on a top surface of the PCBA, ensuring that the plastic materials cover the electronic units 8 on the top surface of the PCBA, and obtaining a first-time plastic-sealing PCBA after the plastic materials are solidified;

Step S13: pasting tightly a functional film 9 on a top surface of the first-time plastic-sealing PCBA to obtain a film-pasted PCBA; and Step S14: implementing a second-time filling to fill on plastic materials on the film-pasted PCBA, ensuring that the plastic materials cover a top surface and a periphery of the film-pasted PCBA, and obtaining the SiP module 11 after the plastic materials of the second-time filling are solidified.

As shown in FIG. 3a, the electronic units 8 are mounted on the PCB using a surface mount technology (SMT) so as to produce the PCBA.

Considering that the electronic units 8 may have uneven heights or different sizes, pasting the functional film 9 directly on the electronic units 8 may not be effective. Therefore, before pasting directly the functional film 9, the first-time filling can be adopted to fill on plastic materials on the top surface of the PCBA to ensure that the plastic materials cover the electronic units 8 on the top surface of the PCBA. As shown in FIG. 3b, when the plastic materials of the first-time filling are solidified, flat surfaces (including a flat top surface and flat side surfaces) can be obtained. As shown in FIG. 3c, the functional film 9 can thus be easily adhered on the flat top surface of the first-time plastic-sealing PCBA (i.e., pasted on the top surface of the plastic materials of the first-time filling). Moreover, the functional film 9 will not affect the subsequent second-time filling. As shown in FIG. 3d, the second-time filling can be adopted to be covered on the film-pasted PCBA, ensuring that the plastic materials cover the top surface and the periphery of the film-pasted PCBA (i.e., covering the top surface of the first-time plastic-sealing PCBA and the functional film 9), so as to obtain the SiP module after the plastic materials of the second-time filling are solidified The functional film 9 provided with electromagnetic shielding function is plastic-sealing inside the SiP module. Therefore, the SiP module possesses the electromagnetic shielding function without having to undergo a subsequent metal sputtering process. Specific electromagnetic shielding functions can be provided based on the materials of the functional film 9.

It should be noted that the SiP module has its own requirement of thickness (according to the actual condition of the product). As a result, thicknesses of the first-time plastic-sealing PCBA, the second-time plastic-sealing PCBA and the functional film should be controlled to meet the thickness requirement of the SiP module. Generally, the thickness of the functional film should be less than 50 um.

Figure 2:
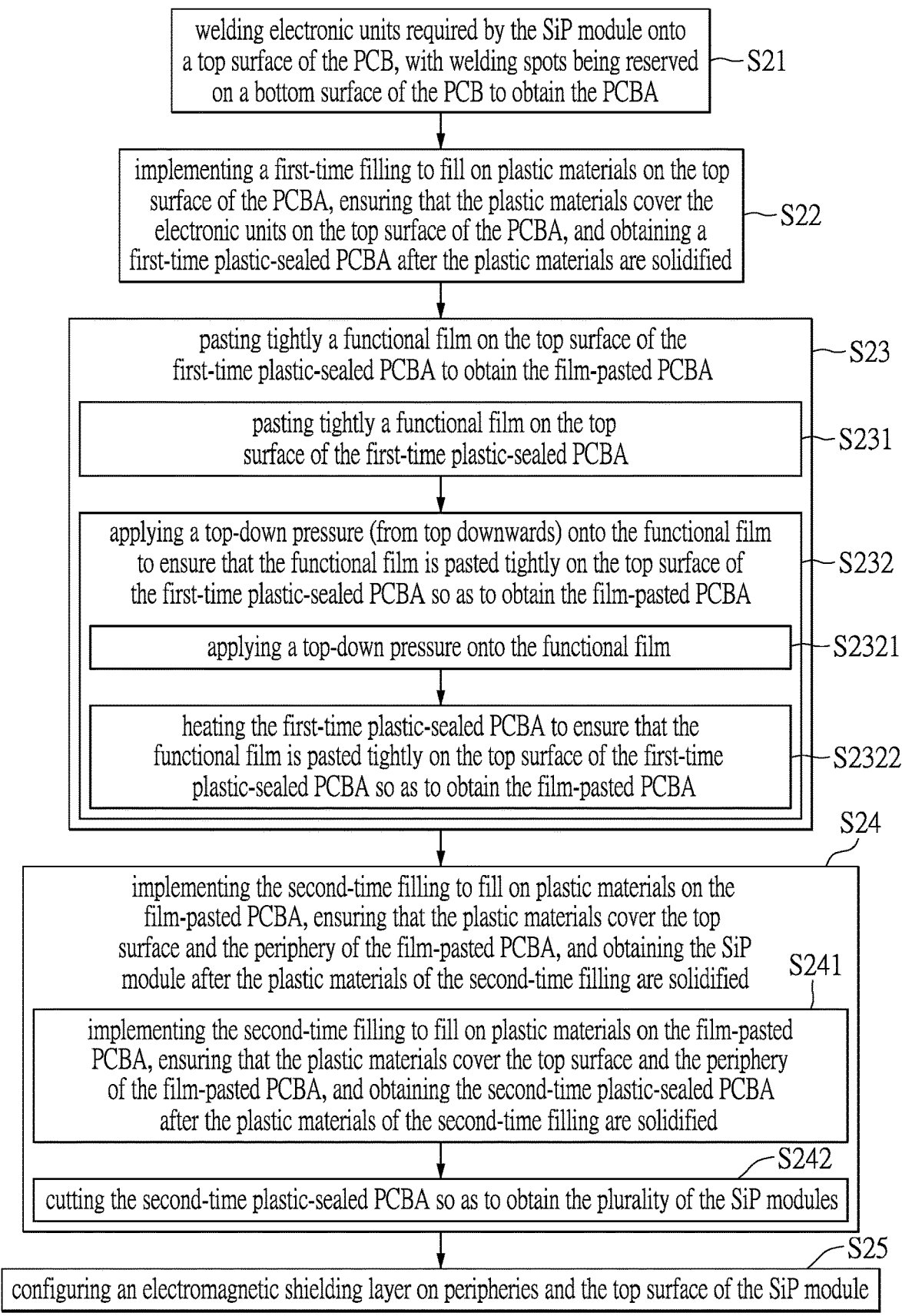
FIG. 2 is a flow chart of another embodiment of the manufacturing method of the SiP module based on double plastic-sealing according to the present disclosure.
Figure 3:
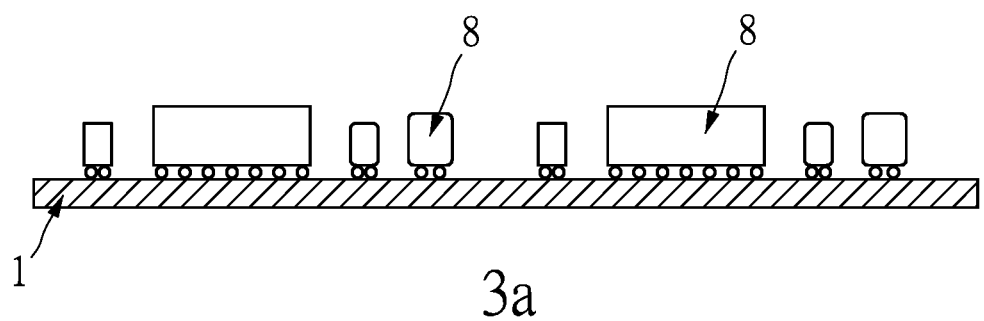
FIG. 3 is a schematic view of a part of a manufacturing process of the SiP module according to the present disclosure.
Figure 3:
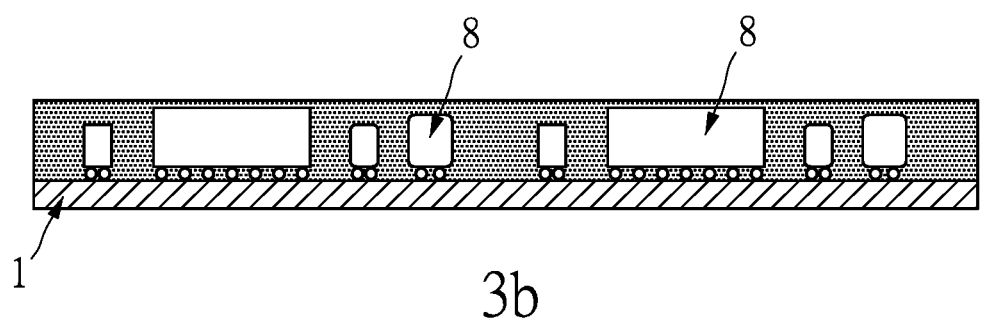
Figure 3:
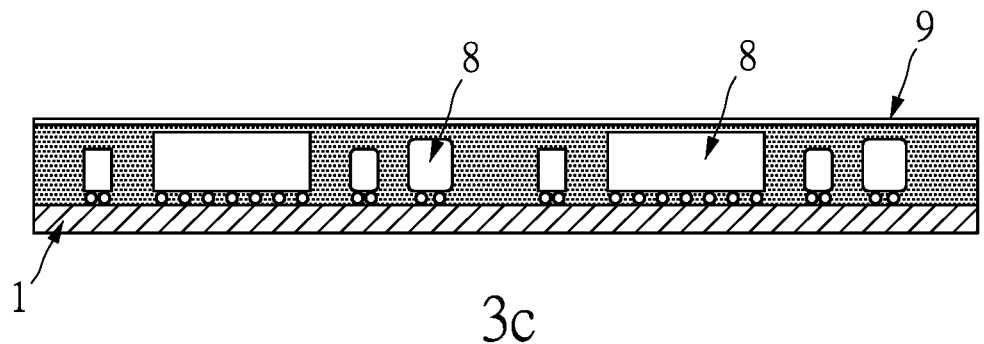
Figure 3:
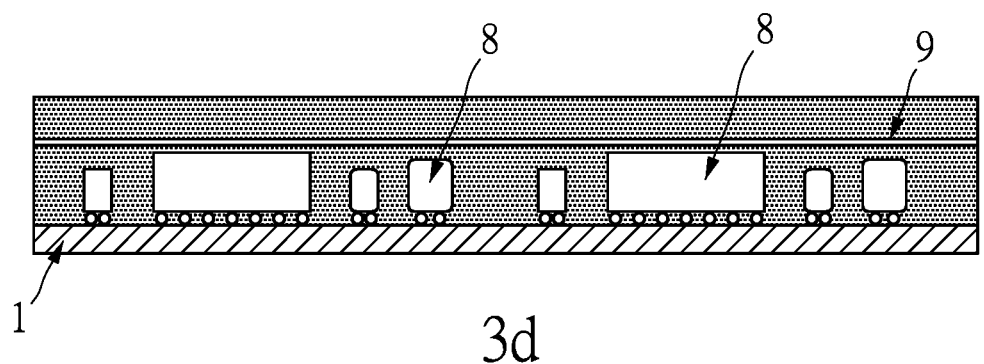
Figure 4:
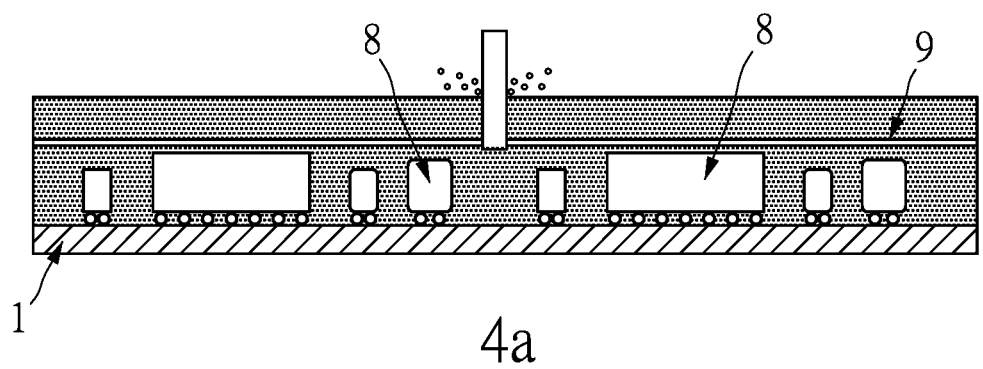
FIG. 4 is a schematic view of another part of the manufacturing process of the SiP module according to the present disclosure.
Figure 4:
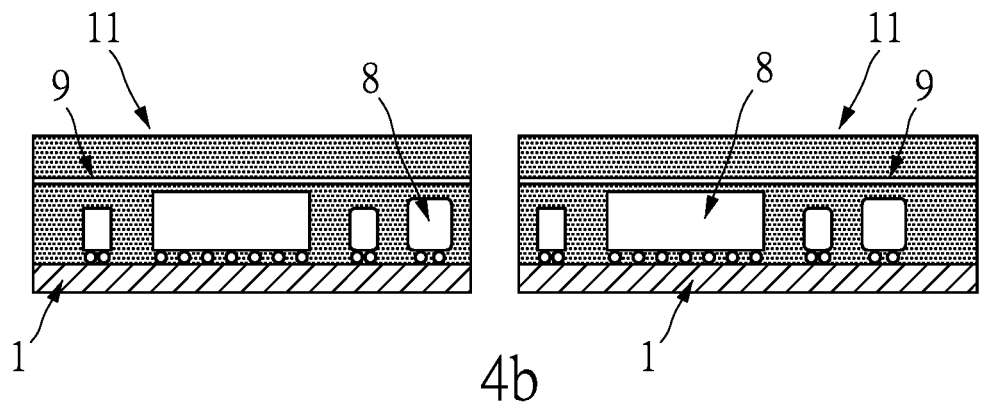
Figure 4:
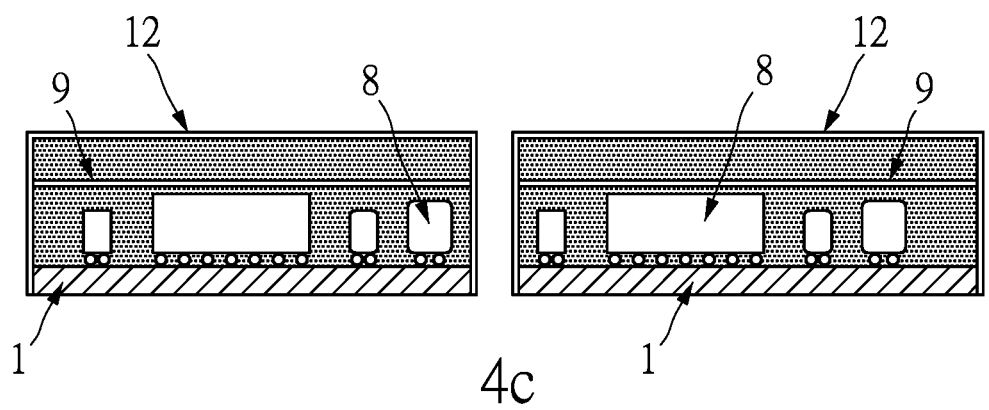

In another embodiment of the present application, as shown in FIGS. 2 to 4, the manufacturing method of the SiP module based on double plastic-sealing includes the following steps of Step S21, Step S22, Step S23 and Step S24.

Step S21: welding electronic units 8 required by the SiP module onto a top surface of the PCB 1, with welding spots being reserved on a bottom surface of the PCB 1 to obtain the PCBA, as shown in FIG. 3a, in which the welding spots reserved on the bottom surface of the PCB 1 are not shown.

Step S22: implementing a first-time filling to fill on plastic materials on the top surface of the PCBA, ensuring that the plastic materials cover the electronic units 8 on the top surface of the PCBA, and obtaining a first-time plastic-sealing PCBA after the plastic materials are solidified, as shown in FIG. 3b.

Step S23: pasting tightly a functional film 9 on the top surface of the first-time plastic-sealing PCBA to obtain the film-pasted PCBA, as shown in FIG. 3c.

Step S24: implementing the second-time filling to fill on plastic materials on the film-pasted PCBA, ensuring that the plastic materials cover the top surface and the periphery of the film-pasted PCBA, and obtaining the SiP module after the plastic materials of the second-time filling are solidified.

The Step S23 further includes the following steps of:

Step S231: pasting tightly a functional film 9 on the top surface of the first-time plastic-sealing PCBA;

Step S232: applying a top-down pressure (from top downwards) onto the functional film 9 to ensure that the functional film 9 is pasted tightly on the top surface of the first-time plastic-sealing PCBA so as to obtain the film-pasted PCBA.

Specifically, the functional film 9 can be a glue layer. When the force is applied from top downwards onto the functional film 9, the functional film 9 is pressed to be pasted tightly on the top surface of the plastic materials of the first-time plastic-sealing PCBA.

When pasting the functional film 9, an entire piece of the functional film 9 can be used to be pasted on the top surface of the solidified plastic materials of the entire PCBA.

When pasting the functional film 9, it may be applicable to paste an entire piece of the functional film 9 on the entire top surface of the solidified plastic materials of the PCBA (i.e., the size of the functional film 9 conforms with that of the top surface of the solidified plastic materials of the PCBA). Alternatively, it may also be applicable to paste multiple pieces of the functional films 9 to respectively cover a plurality of SiP module areas 2 on the PCBA, in which each of the functional films 9 has a size that respectively conforms with the size of each of the SiP module areas 2.

After the functional film 9 is pasted on the entire top surface of the solidified plastic materials of the PCBA, a force can be applied from top downwards onto the functional film 9 to ensure that the functional film 9 is pasted tightly on the top surface of the solidified plastic materials. The way of applying the top-down force onto the functional film 9 to ensure that the functional film 9 is pasted tightly on the top surface of the solidified plastic materials can be applicable to the pasting of the entire piece of the functional film 9 and multiple pieces of the functional films 9.

The reason that the functional film 9 needs to be pasted tightly on the top surface of the solidified plastic materials is that a flow pressure generated by the plastic materials 10 during the subsequent plastic sealing process will impact the functional film 9. The functional film 9 could even be washed away by the flow pressure if the functional film 9 is not pasted tightly on the top surface of the first-time plastic-sealing PCBA, thereby causing the SiP module obtained after the second-time filling to not possess electromagnetic shielding functions.

For example, heat-resistant foam can be placed on the top of the functional film 9 after the functional film 9 is pasted on the top surface of the solidified plastic materials. After that, a heavy weight can be placed on the top of the heat-resistant foam for pressing the heat-resistant foam and the functional film 9 to cause deformation thereof, which enables the functional film 9 to be pasted more tightly onto the top surface of the solidified plastic materials.

Preferably, the Step S232 includes the following steps of Step S2321 and Step S2322.

Step S2321: applying a top-down pressure onto the functional film 9.

Step S2322: heating the first-time plastic-sealing PCBA to ensure that the functional film 9 is pasted tightly on the top surface of the first-time plastic-sealing PCBA so as to obtain the film-pasted PCBA.

Specifically, if the adhesive layer of the functional film 9 is thermosetting glue, after the top-down pressure is applied, the PCBA can be heated to ensure that the functional film 9 is pasted even more tightly on the surface of the plastic materials. Therefore, the SiP module after the second-time filling can possess a better electromagnetic shielding effect.

Specifically, the Step S24 includes the following steps of Step S241 and Step S242.

Step S241: implementing the second-time filling to fill on plastic materials on the film-pasted PCBA, ensuring that the plastic materials cover the top surface and the periphery of the film-pasted PCBA, and obtaining the second-time plastic-sealing PCBA after the plastic materials of the second-time filling are solidified, as shown in FIG. 3d.

Step S242: cutting the second-time plastic-sealing PCBA so as to obtain the plurality of the SiP modules, as shown in FIGS. 4a and 4b.

Specifically, in order to improve the efficiency of the manufacturing process, the electronic units 8 required by the SiP modules 11 are mounted on the PCB 1. The SiP modules 11 will be obtained after the second-time filling and cut.

Selectively, the manufacturing method of the SiP module based on double plastic-sealing can further include Step S25: configuring an electromagnetic shielding layer 12 on peripheries and the top surface of the SiP module.

Specifically, in case where multiple electromagnetic shielding effects are required at the same time based on actual requirement, the functional film 9 and the electromagnetic shielding layer 12 on the peripheries and the top surfaces of the SiP module 11 after the second-time filling can be jointly applied for manufacturing of the SiP modules 11.

Specifically, the electromagnetic shielding layer 12 can be configured on the peripheries and the top surfaces of the SiP module 11 by various techniques, such as metal sputtering, pasting metal film, and configuring an electromagnetic shielding mask.

For instance, if electromagnetic shielding is required to shield against both the radio frequency (RF) signals with low frequency band and the RF signals with medium-high frequency band, the functional film 9 made of ferric oxide material for absorbing the RF signals with low frequency band can be pasted and pressed on the top surfaces of the plastic materials of first-time plastic-sealing PCBA. After being solidified by heat, the PCBA is second-time plastic-sealing and cut for obtaining the SiP modules 11. Then, the metal sputtering is applied on the peripheries and the top surfaces of the SiP modules 11 to form the electromagnetic shielding layer 12 that is capable of absorbing the RF signals with medium-high frequency band. As a result, the SiP modules 11 may simultaneously shield against both the RF signals with low frequency band and the RF signals with medium-high frequency band. As shown in FIG. 4c, the electromagnetic shielding layer 12 is formed on the peripheries and the top surfaces of two SiP modules.

In this embodiment, by usage of the functional film 9 and the electromagnetic shielding layer 12, the SiP modules is able to guard against the RF signals with multiple frequency bands, thereby improving the effect of the electromagnetic shielding of the SiP modules. Moreover, the functional films 9 made of different materials enable the SiP module to possess different electromagnetic shielding functions.

It should be noted that if the functional film 9 in any of the embodiment of the present application is an entire piece with the size being able to cover the plurality of the SiP module areas 2, the functional film 9 includes a plurality of film units 5 spaced apart from each other by cutting channels 4, in which each of the cutting channels 4 is connected to adjacent ones of the film units 5 and is formed with a hollow portion, and each of the film units corresponds to a respective one of the SiP modules.

Figure 5:
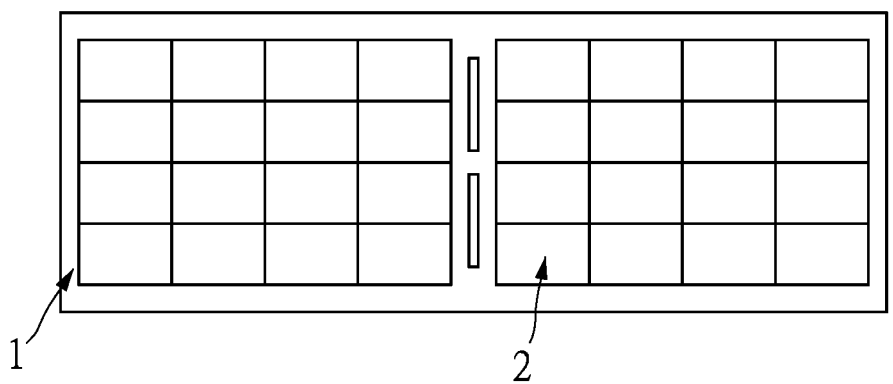
FIG. 5 is a schematic view of the SiP module area on a printed circuit board of two connected boards according to the present disclosure.
Figure 6:
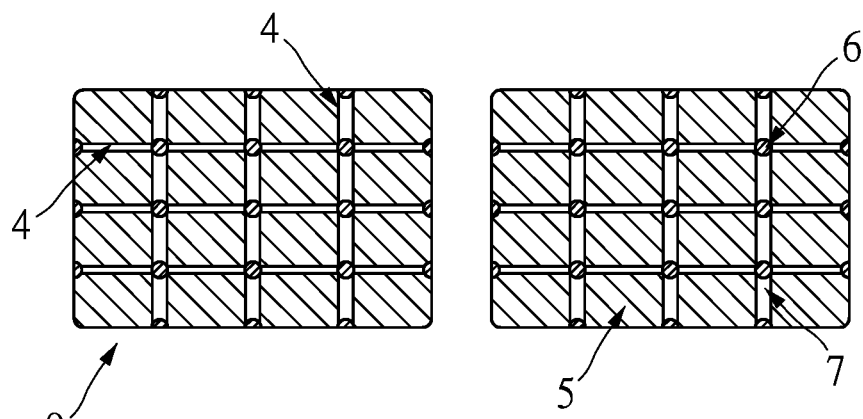
FIG. 6 is a schematic view of a functional film designed for the SiP module area of FIG. 5.

FIG. 6 shows a pair of the same functional films 9 designed to correspond respectively to the SiP module areas 2 on the PCB 1 of two connected boards shown in FIG. 5.

The functional film 9 shown on the left of FIG. 6 is taken for example in the following description.

The functional film 9 generally includes a glue layer and a functional layer. The functional layer is positioned on a top surface of the glue layer. The functional layer is attached on the surface of the electronic units 8 via the glue layer. For example, the functional film 9 can be made of ferric oxide material for absorbing the RF signals with low frequency band, and be pasted on the top surfaces of the plastic materials 10 of first-time filling. Therefore, after the second-time filling, the SiP modules 11 can absorb the RF signals with low frequency band and possess the electromagnetic shielding functions When the functional film 9 is designed to correspond in size to the PCBA, the functional film 9 will be required to include the plurality of the film units 5, in which each of the film units 5 corresponds in size to the respective one of the SiP module areas 2 on the PCBA. The plurality of film units 5 are spaced apart from each other by the cutting channels 4. The cutting channels 4 are reserved as the electronic devices are mounted. The second-time plastic-sealing PCBA is cut along the cutting channels 4, and the SiP modules 3 are obtained.

For example, the PCB can be divided into sixteen areas. Each of the areas is configured with one of the SiP modules. The electronic units 8 required by the sixteen SiP modules are mounted, in which spaces between areas will be reserved for the subsequent cutting process. The reserved spaces are where the cutting channels 4 are located.

Since the functional film 9 is sticky, it is likely to be adhered onto the cutting blades (which may produce metal burrs) during the cutting process if an entire piece of the functional film (without a hollow portion thereon) is applied on the top surface of the plastic materials 10 of first-time filling for the subsequent second-time plastic sealing and cutting processes.

Consequently, the cutting channels 4 are configured with the hollow portions. In other words, parts of the cutting channels 4 are connected to the film units 5, and parts of the cutting channels 4 are configured with the hollow portions. By such configuration, the combining strength of double plastic-sealing may be improved, and the issue associated with metal burrs may be prevented. Moreover, since parts of the cutting channels 4 are connected to the film units 5, the functional film 9 is configured to include the plurality of the film units 5 and is easy to be pasted directly onto the PCBA that has the plurality of the SiP module areas. Thus, the manufacturing process of the SiP modules can be simplified.

The cutting channels 4 include a plurality of horizontal cutting channels and a plurality of vertical cutting channels. Each of the horizontal cutting channels is formed with the hollow portion that is independent from each of the vertical cutting channels. Each of the vertical cutting channels is formed with a hollow portion that is independent from each of the horizontal cutting channels. Each of the horizontal cutting channels intersects with each of the vertical cutting channels at an intersect area 6 that is connected to adjacent ones of the film units.

Specifically, the intersect area 6 expands from the center of an intersection of the horizontal cutting channel and the vertical cutting channel to form an area with a certain size, said center being co-located with a center of the intersect area 6. The remaining parts of the cutting channels 4 other than the intersect areas 6 are regarded as the hollow areas 7.

The size of the intersect areas 6 is configurable based on actual requirements, and the shape of the intersect areas 6 is also not limited, as long as the adjacent film units 5 can be connected via the intersect areas 6.

For example, the intersect area 6 can be a circular area having a predetermined radius (e.g., 20 um), while the other areas of the cutting channels 4 are the hollow areas 7.

The hollow areas 7 of the cutting channels 4 of the functional film 9 in this embodiment can be configured at different positions of the cutting channels 4. Moreover, the size and shape of the hollow areas 7 can be various.

Figures 7, 8:
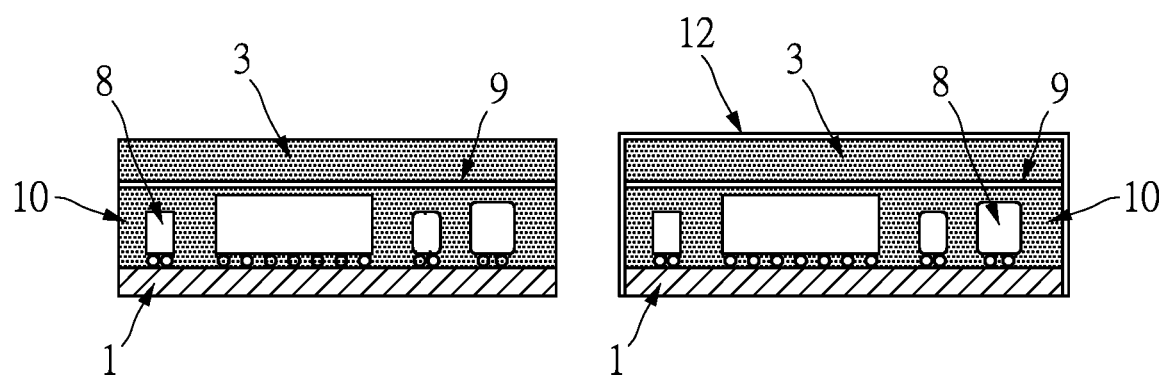
FIG. 7 is a schematic view of an embodiment of the SiP module according to the present disclosure.
FIG. 8 is a schematic view of another embodiment of the SiP module according to the present disclosure.

In other embodiment of the present disclosure, as shown in FIG. 7, the SiP module 11 includes: the PCB 1 that has the top surface with the electronic units 8 required by the SiP module 11 provided thereon, and the bottom surface with reserved welding spots (not shown) provided thereon; the first-time plastic-sealing layer 10 that covers the electronic devices 8; the functional film 9 that is pasted tightly on the surface of the first-time plastic-sealing layer 10; and the second-time plastic-sealing layer 3 that covers the functional film 9 and the first-time plastic-sealing layer 10.

If the functional film 9 adopt the materials that possess electromagnetic shielding function, the SiP module after double plastic-sealing will possess electromagnetic shielding functions.

Selectively, the peripheries and the top surface of the SiP module 11 are configured with the electromagnetic shielding layer 12 as shown in FIG. 8.

In case where multiple electromagnetic shielding effects are required at the same time based on actual requirement, the functional film 9 and the electromagnetic shielding layer 12 on the peripheries and the top surfaces of the SiP module 11 after the second-time filling can be jointly applied to meet the requirement.

As mentioned above, by usage of the functional film 9 and the electromagnetic shielding layer 12, the SiP modules are able to shield against the RF signals with multiple frequency bands, thereby improving the effect of the electromagnetic shielding of the SiP modules.

In conclusion, compared with the conventional techniques, the SiP module and the manufacturing method of the SiP module based on double plastic-sealing according to the present disclosure have beneficial effects of: applying double plastic sealing to seal the functional film that provided with electromagnetic shielding function and the electronic devices simultaneously, such that the SiP module possesses electromagnetic shielding function after the plastic sealing is performed, thereby simplifying the manufacturing process of the SiP module. Furthermore, the manufacturing method of the SiP module can be combined with the metal sputtering process, thereby improving the effect of electromagnetic shielding of the SiP module.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A manufacturing method of a system in package (SiP) module based on double plastic-sealing, the manufacturing method comprising the steps of:
   welding electronic units required by the SiP module onto a top surface of a Printed Circuit Board (PCB), with welding spots being reserved on a bottom surface of the PCB to obtain a PCB assembly (PCBA);
   implementing a first-time filling to fill on plastic materials on a top surface of the PCBA, ensuring that the plastic materials cover the electronic units on the top surface of the PCBA, and obtaining a first-time plastic-sealing PCBA after the plastic materials are solidified;
   pasting tightly a functional film on a top surface of the first-time plastic-sealing PCBA to obtain a film-pasted PCBA; and
   implementing a second-time filling to fill on plastic materials on the film-pasted PCBA, ensuring that the plastic materials cover a top surface and a periphery of the film-pasted PCBA, and obtaining the SiP module after the plastic materials of the second-time filling are solidified.

2. The manufacturing method of the SiP module based on double plastic-sealing according to claim 1, wherein the functional film includes:
   a plurality of film units being spaced apart from each other by cutting channels, wherein each of the cutting channels is connected to adjacent ones of the film units and is formed with a hollow portion, and wherein each of the film units corresponds to a respective one of the SiP modules.

3. The manufacturing method of the SiP module based on double plastic-sealing according to claim 1, wherein the step of pasting tightly the functional film on the top surface of the first-time plastic-sealing PCBA to obtain the film-pasted PCBA further includes:
   pasting the functional film on the top surface of the first-time plastic-sealing PCBA; and
   applying a top-down pressure onto the functional film to ensure that the functional film is pasted tightly on the top surface of the first-time plastic-sealing PCBA to obtain the film-pasted PCBA.

4. The manufacturing method of the SiP module based on double plastic-sealing according to claim 3, wherein applying a top-down pressure onto the functional film to ensure that the functional film is pasted tightly on the top surface of the first-time plastic-sealing PCBA to obtain the film-pasted PCBA further includes:
   applying a top-down pressure onto the functional film; and
   heating the first-time plastic-sealing PCBA until the plastic materials are solidified to ensure that the functional film is pasted tightly on the top surface of the first-time plastic-sealing PCBA so as to obtain the film-pasted PCBA.

5. The manufacturing method of the SiP module based on double plastic-sealing according to claim 1, wherein the step of implementing the second-time filling to fill on plastic materials on the film-pasted PCBA, ensuring that the plastic materials cover the top surface and the periphery of the film-pasted PCBA, and obtaining the SiP module after the plastic materials of the second-time filling are solidified further includes:
   implementing the second-time filling to fill on plastic materials on the film-pasted PCBA, ensuring that the plastic materials cover the top surface and the periphery of the film-pasted PCBA, and obtaining a second-time plastic-sealing PCBA after the plastic materials of the second-time filling are solidified; and
   cutting the second-time plastic-sealing PCBA so as to obtain a plurality of the SiP modules.

6. The manufacturing method of the SiP module based on double plastic-sealing according to claim 5, further comprising the step of: configuring an electromagnetic shielding layer on a periphery and a top surface of the SiP module.

7. The manufacturing method of the SiP module based on double plastic-sealing according to claim 6, wherein the functional film includes:
   a plurality of film units being spaced apart from each other by cutting channels, wherein each of the cutting channels has a portion connected to adjacent ones of the film units and is formed with a hollow portion, and wherein each of the film units corresponds to a respective one of the SiP modules.

8. The manufacturing method of the SiP module based on double plastic-sealing according to claim 7, wherein:
   the cutting channels include horizontal cutting channels and vertical cutting channels; and
   each of the horizontal cutting channels is formed with the hollow portion that is independent from each of the vertical cutting channels, each of the vertical cutting channels is formed with a hollow portion that is independent from each of the horizontal cutting channels, each of the horizontal cutting channels intersects with each of the vertical cutting channels to form the portion that is connected to adjacent ones of the film units.

* * * * *